(12) United States Patent
Bowman

(10) Patent No.: US 9,312,684 B2
(45) Date of Patent: Apr. 12, 2016

(54) SOLID STATE SWITCH

(71) Applicant: REMY TECHNOLOGIES, L.L.C., Pendleton, IN (US)

(72) Inventor: William E. Bowman, Fishers, IN (US)

(73) Assignee: REMY TECHNOLOGIES, LLC., Pendleton, IN (US)

( * ) Notice: Subject to any disclaimer, the term of this patent is extended or adjusted under 35 U.S.C. 154(b) by 100 days.

(21) Appl. No.: 14/327,119

(22) Filed: Jul. 9, 2014

(65) Prior Publication Data

US 2015/0015998 A1   Jan. 15, 2015

Related U.S. Application Data

(60) Provisional application No. 61/844,210, filed on Jul. 9, 2013.

(51) Int. Cl.
  *H02H 7/08*  (2006.01)
  *H03K 17/0814*  (2006.01)
  *H03K 17/12*  (2006.01)

(52) U.S. Cl.
  CPC ........... *H02H 7/08* (2013.01); *H03K 17/08142* (2013.01); *H03K 17/122* (2013.01)

(58) Field of Classification Search
  CPC .......................... H02H 7/08; H03K 17/08142
  USPC ............................ 361/31, 87, 5; 318/432, 434
  See application file for complete search history.

(56) References Cited

U.S. PATENT DOCUMENTS

| | | | | |
|---|---|---|---|---|
| 5,469,351 A | * | 11/1995 | Masrur ................ | H02H 7/1227 363/37 |
| 5,659,283 A | * | 8/1997 | Arratia .................. | H01H 85/32 337/206 |
| 5,821,783 A | * | 10/1998 | Torimaru ....... | H03K 19/018521 326/87 |
| 7,333,315 B2 | * | 2/2008 | Kawazu .................. | H01M 2/34 361/104 |
| 8,686,596 B2 | * | 4/2014 | Huss ...................... | H01H 85/32 307/117 |
| 2004/0017246 A1 | * | 1/2004 | Kothandaraman ..... | G11C 17/18 327/525 |
| 2012/0086370 A1 | | 4/2012 | Tseng | |

FOREIGN PATENT DOCUMENTS

| JP | 11203888 A | 7/1999 |
|---|---|---|
| JP | 2005202124 A | 7/2005 |
| KR | 2019980030166 U | 8/1998 |

OTHER PUBLICATIONS

Notification of Transmittal of the International Search Report and the Written Opinion of the International Searching Authority, or the Declaration; PCT/US2014/045955; Mail date: Oct. 24, 2014, 10 pages.

* cited by examiner

*Primary Examiner* — Rita Leykin
(74) *Attorney, Agent, or Firm* — Cantor Colburn LLP

(57) ABSTRACT

A solid-state switch includes a plurality of transistors connected in parallel and a plurality of fuses. Each fuse is connected in series with a separate one of the plurality of transistors. A combination of current ratings of the plurality of fuses is greater than a load current of a load connected to the plurality of transistors and the plurality of fuses, and a current rating of each separate fuse of the plurality of fuses is less than the load current.

16 Claims, 3 Drawing Sheets

SOLID STATE SWITCH

CROSS REFERENCE TO RELATED APPLICATIONS

This application claims the benefit of an earlier filing date from U.S. Provisional Application Ser. No. 61/844,210 filed Jul. 9, 2013, the entire disclosure of which is incorporated herein by reference.

BACKGROUND

The present invention relates to a solid state switch.

Switches are used to route current from a source to a load. With a mechanical switch, a conductive element is placed between the source and the load terminals. Generally a force on the mechanical switch is opposed by a spring mechanism that keeps the conductive element off the load terminals when the switch is not asserted. Mechanical switches include inherent weaknesses such as wear of contact surfaces and bouncing of the switch in a switching operation which may cause arcing and switch delays. In addition, mechanical switches that are actuated with electromagnets require high current levels to move contactors.

Solid-state switches, such as transistor-based switches, generally avoid these weaknesses, since there is no wear, no bouncing and no arcing in solid-state switches. Additionally, solid-state switches do not require high power levels to turn the switches on and off. However, when transistors are used as switches, the switch may be stuck in an "on" state if the transistor fails, since transistors tend to fail in an asserted state. In an example in which a transistor switch is used to drive a solenoid of a starting motor, failure of the transistor may continue to crank the starting motor until a battery voltage drops below a predetermined level corresponding to a hold-in current, or the starting motor may be damaged by over-running the motor.

SUMMARY

Embodiments of the invention include a solid-state switch including a plurality of transistors connected in parallel and a plurality of fuses. Each fuse is connected in series with a separate one of the plurality of transistors. A combination of current ratings of the plurality of fuses is greater than a load current of a load connected to the plurality of transistors and the plurality of fuses, and a current rating of each separate fuse of the plurality of fuses is less than the load current.

Embodiments of the invention also include a solid-state switch that includes a first transistor, a second transistor having a gate connected to a gate of the first transistor, and a third transistor having a gate connected to the gates of the first and second transistors. The solid-state switch also includes a first fuse connected to one of the source and the drain of the first transistor, the first fuse being connected in series with the first transistor. The switch includes a second fuse connected to one of the source and the drain of the second transistor, the second fuse being connected in series with the second transistor. The solid-state switch also includes a third fuse connected to one of the source and the drain of the third transistor, the third fuse being connected in series with the third transistor. The first transistor and first fuse are connected in parallel with the second transistor and the second fuse, and with the third transistor and the third fuse. A current rating of each of the first, second and third fuses is less than a load current of a load connected to the first, second and third transistor s, and a combination of the current ratings of the first, second and third fuses is greater than the load current.

Embodiments of the invention also include a motor assembly. The motor assembly includes a battery, a load configured to operate at a load current, and a solid-state switch connected between the battery and the load. The solid-state switch includes a plurality of transistors connected in parallel between the battery and the load and a plurality of fuses connected in series with the plurality of transistors, such that each one of the plurality of fuses is connected in series with a separate one of the plurality of transistors. The plurality of transistors and the plurality of fuses are configured such that one of the plurality of fuses is opened to prevent current flow through a first transistor based on the rest of the transistors being turned off and the first transistor remaining on.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Conventional transistor switches suffer from remaining in an asserted state when the transistor fails, which may result in damage to a load being driven by the transistor switch. Embodiments of the invention relate to a solid-state switch having a fail-safe configuration of a plurality of transistors such as but not limited to Metal Oxide Semiconductor Field Effect Transistors (MOSFETs) and fuses connected in parallel. It is to be understood that the invention will have function with any type of transistor.

Figure 1:
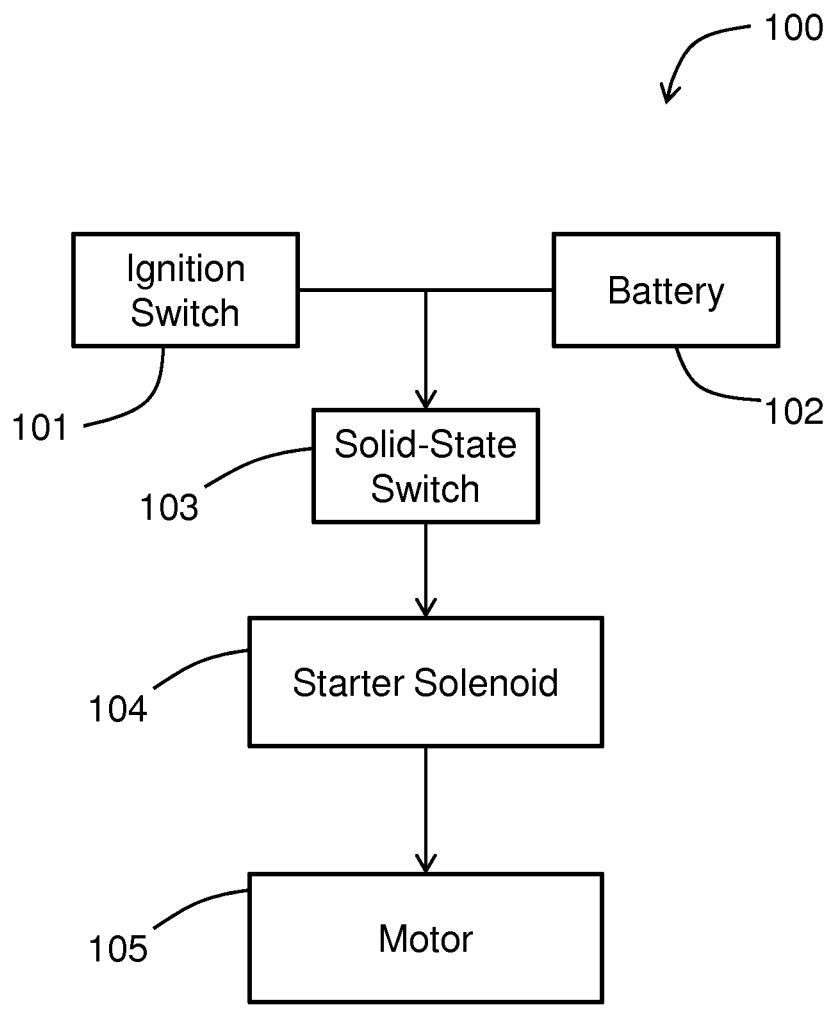
FIG. 1 illustrates a motor assembly according to an embodiment of the invention.

FIG. 1 illustrates a motor assembly 100 according to an embodiment of the invention. The motor assembly 100 includes an ignition switch 101, battery 102, solid-state switch 103, starter solenoid 104 and motor 105. The ignition switch 101 may be any type of ignition switch including keys, buttons, switches, or any other switch that is capable of connecting and disconnecting the battery 102 to and from the solid-state switch 103.

The solid-state switch 103 receives an activation voltage from the battery 102 based on the state of the ignition switch 101. When the ignition switch 101 is activated, current is supplied from the battery 102 to the solid-state switch 103, providing an activation voltage to the solid-state switch 103.

In one embodiment of the invention, the solid-state switch 103 includes a plurality of MOSFETs and fuses connected in parallel between a gate node and a load to provide a fail-safe mechanism that prevents the solid-state switch 103 from remaining in an activated state when one or more of the MOSFETs fails in the solid-state switch. The gate node may be connected to the battery 102 via the ignition switch 101 and to the gate of each MOSFET of the solid-state switch 103. While FIG. 1 illustrates a plurality of MOSFETs by way of example, embodiments of the invention are not limited to MOSFETs, but may be implemented using any transistors.

In FIG. 1, the load is a motor 105 that receives a current via the starter solenoid 104 which receives a starting current from the solid-state switch 103 based on the battery 102 supplying the activation voltage to the solid-state switch 103. The starter solenoid 104 provides an activation current to the motor 105 to crank the motor 105. In one embodiment, the motor 105 is a starter motor configured to start an engine, such as a vehicle engine or any other engine.

While FIG. 1 illustrates one embodiment of a motor assembly 100 including the solid-state switch 103, embodiments of the invention encompass any assembly or system that implements the solid-state switch 103, including electrical systems, mechanical system, hydraulic systems, computer systems, or any combination of electrical, mechanical, hydraulic, and computer systems that utilize a solid-state switch 103 to activate a component of the system.

Figure 2:
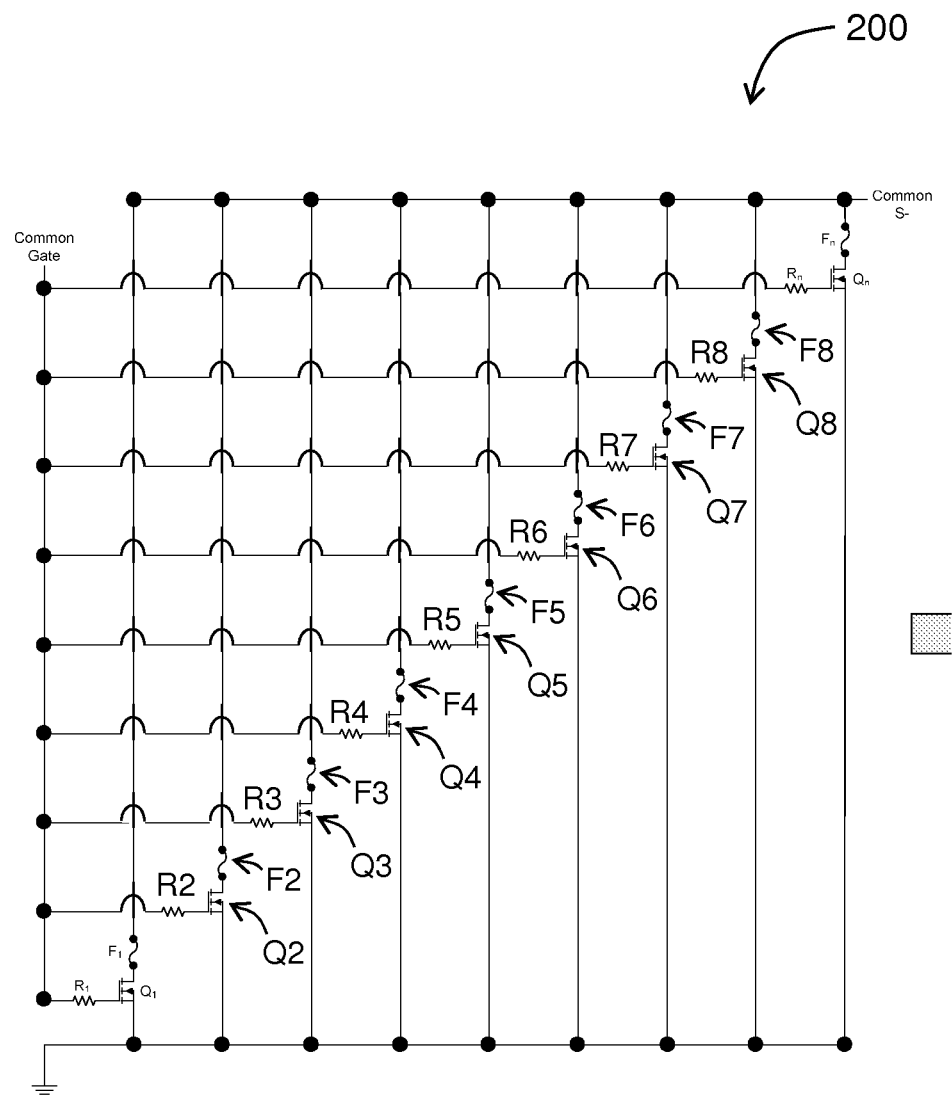
FIG. 2 illustrates a solid-state switch according to an embodiment of the invention.

FIG. 2 illustrates a solid-state switch 200 according to an embodiment of the invention. The solid-state switch 200 includes MOSFETs $Q_1$ to $Q_n$ connected in parallel between ground and a current source (Common S-). The gates of all of the MOSFETs $Q_1$ to $Q_n$ are connected to each other at a common gate. Each MOSFET $Q_1$ to $Q_n$ includes a gate resistance $R_1$ to $R_n$. Fuses $F_1$ to $F_n$ are connected in series between a terminal of the MOSFETs $Q_1$ to $Q_n$ and the current source (Common S-). In FIG. 2, the fuses $F_1$ to $F_n$ are connected between a drain of the MOSFETs $Q_1$ to $Q_n$ and the current source (Common S-). However, it is understood that the fuses $Q_1$ to $Q_n$ may also be connected to the sources of the MOSFETs $Q_1$ to $Q_n$, and the locations of the ground and the current source (Common S-) illustrated in FIG. 2 may be reversed. In addition, while a load is not illustrated in FIG. 2, it is understood that in operation, a load may be located between the current source (Common S-) and the MOSFETs $Q_1$ to $Q_n$.

In addition, while FIG. 2 illustrates N-channel MOSFETs, embodiments include solid-state switches implemented with P-channel MOSFETs.

In operation, when an activation voltage is supplied to the common ground node, the gates of each of the MOSFETs $Q_1$ to $Q_n$ are activated. Since the MOSFETs $Q_1$ to $Q_n$ are connected in parallel, the current flowing from the current source (Common S-) to the ground is divided among the MOSFETs $Q_1$ to $Q_n$. In embodiments of the invention, a current rating of the fuses $F_1$ to $F_n$ is selected such that the combined current rating of the fuses $F_1$ to $F_n$ is greater than the load current of the current source (Common S-).

In addition, the solid-state switch 200 may be configured such that any subset of the fuses $F_1$ to $F_n$, which subset includes a number of fuses less than all of the fuses $F_1$ to $F_n$, may have a combined current rating greater than the load current of the current source (Common S-). For example, the switch 200 may be configured such that the combined current rating of any three fuses among the fuses $F_1$ to $F_n$ is greater than the load current of the current source (Common S-). When one of the MOSFETs $Q_1$ to $Q_n$ fails, the failed MOSFET remains in an activated state even when the activating voltage is removed from the gate of the MOSFET.

For example, if the MOSFET $Q_1$ was to fail, then when the activating voltage is removed from the common gate, the MOSFET $Q_1$ would remain on, while the MOSFETs $Q_2$ to $Q_n$ would turn off. As a result, the entire current would flow through the MOSFET $Q_1$ and fuse $F_1$. The fuse $F_1$ would be blown or opened and the flow of the current through the MOSFET $Q_1$ would stop. In this manner, a failed MOSFET is removed from operation and does not continue to provide current to a load after the MOSFET fails.

Then, when another activating voltage is applied to the common gate, the remaining MOSFETs $Q_2$ to $Q_n$ would be turned on and the current would be divided among the activated MOSFETs $Q_2$ to $Q_n$. In this manner, the solid-state switch 200 is "self-healing," by automatically removing from operation a failed MOSFET $Q_1$ while maintaining in operation the MOSFETs $Q_2$ to $Q_n$. The MOSFETs $Q_2$ to $Q_n$ are connected in series with fuses $F_2$ to $F_n$ which have a combined current rating greater than the load current of the current source (Common S-), so that the fuses $F_2$ to $F_n$ are not opened and the solid-state switch 200 continues operating even after the loss of the MOSFET $Q_1$.

While nine MOSFETs $Q_1$ to $Q_n$ and nine fuses $F_1$ to $F_n$ are illustrated in FIG. 2, embodiments of the invention encompass any number of MOSFETs, from as few as two MOSFETs connected in parallel with each other, and in series with respective fuses, to any number of desired MOSFETs connected in series with respective fuses (e.g. ten, one hundred, one thousand, etc.).

In embodiments of the invention incorporating the "self-healing" feature, in which the solid-state switch continues operation even after the loss of one or more MOSFETs due to failure, at least three MOSFETs and fuses are implemented in the solid-state switch, such that each MOSFET is connected in series with a fuse to form a leg of the solid-state switch, and each leg is connected in series with each other leg. The current rating of any two of the fuses is greater than the load current of a current source, such that when one MOSFET fails and the corresponding fuse is opened, the other two MOSFETs may continue operating.

Figure 3:
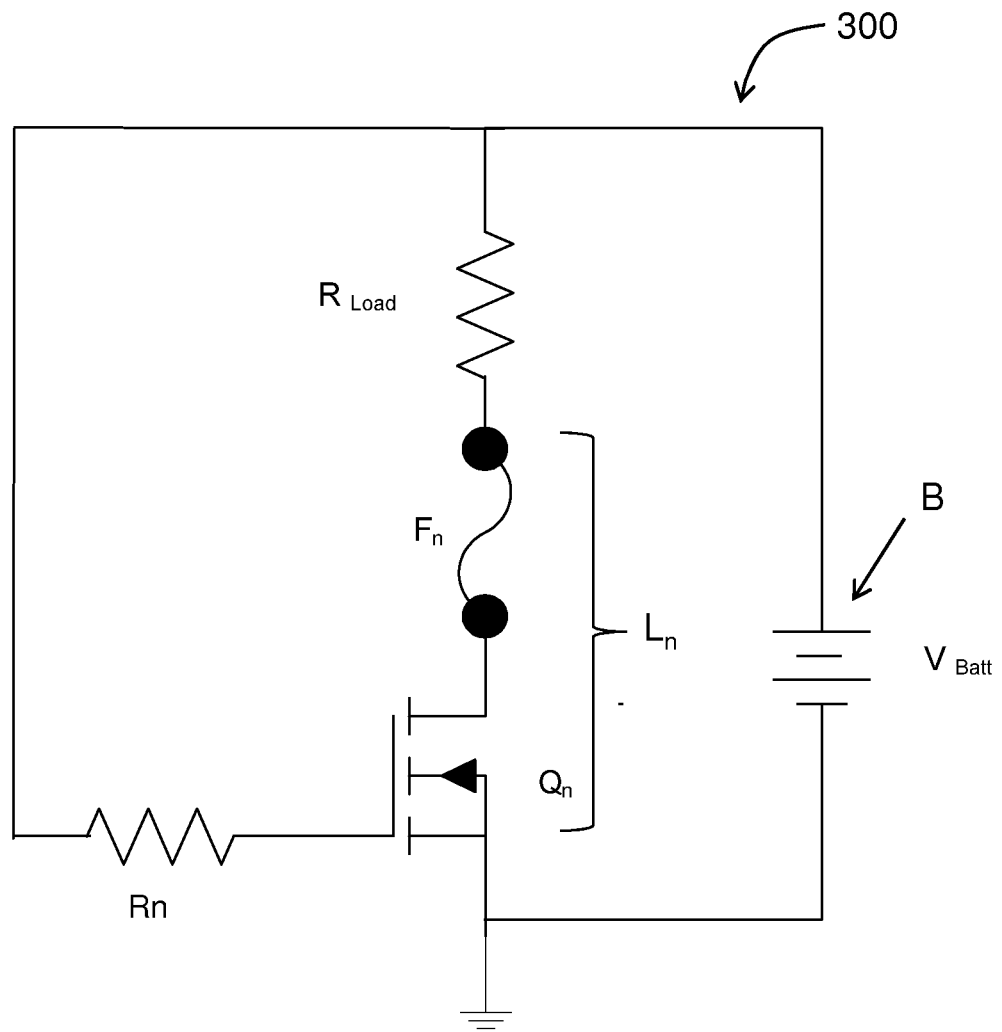
FIG. 3 illustrates an equivalent circuit of the solid-state switch connected to a load according to an embodiment of the present invention.

FIG. 3 is a representation of a circuit 300 approximating the solid-state switch 200 of FIG. 2 having an array of fuses $F_n$ having a "self-healing" characteristic. The circuit 300 of FIG. 3 is used to describe an example of operation of the solid-state switch 200 according to an embodiment of the invention. While values for voltages, resistances, legs (i.e. MOSFET and fuse connected in series), and fuse current ratings are provided to describe the example, it is to be understood that the particular values for activation voltages, load and channel resistances, legs and fuse current ratings may be adapted to particular design constraints of a system in which a solid-state switch is implemented. For example, systems requiring higher levels of redundancy may include more legs than systems requiring lower levels of redundancy. In addition, systems requiring higher levels of load current may utilize fuses having higher current ratings than systems requiring lower load currents.

By way of example, with reference to FIG. 3, $R_{Load}$ is the resistance of a load, and has a value of 1 ohm. $V_{Batt}$ is a voltage from a battery and has a value of 10 volts. In other words, when the battery is connected to the MOSFETs $Q_n$, the battery supplies an activation of 10 volts. The variable "n" represents the number of legs L in the solid state circuit, and by way of example, n equals 10. Each leg L includes one MOSFET Q connected in series with a fuse F. Since n equals 10, the embodiment presently described by way of example includes ten MOSFETs Q and ten fuses F, each MOSFET Q connected in series with a fuse F, and each leg L connected in parallel with each other leg L. In the present example, each fuse F has a current rating of 2 amps. In FIG. 3, $R_n$ is a gate resistance. For purposes of simplicity in describing this example, the channel resistance $R_n$ is assumed to be zero (0).

When a battery voltage is applied to a common gate node of the MOSFETs $Q_n$, the MOSFETs $Q_n$ turn on, splitting the current into ten paths. In other words, each leg L including a MOSFET Q and fuse F connected in series receives a substantially equal current.

The total load current is approximately 10 volts/1 ohm=10 amps. Thus the leg current is 1 amp (10 amps/10 legs L). Since the fuse current of the legs is 2 amps, the legs L have the capacity to pass the 1 amp of leg current. It is to be understood that this analysis is provided by way of example only, and is a simplified analysis that ignores the MOSFET and circuit resistances.

If one of the MOSFETS $Q_1$ fails during operation, it will fail short, or remain in an asserted state. When the switch is turned off by setting the gate voltage to zero (0) volts, the shorted MOSFET $Q_1$ will remain on, but all the other MOSFETs $Q_2$ to $Q_n$ will open, or change to a non-asserted state. As a result, the entire load current (10 amps) is forced through the shorted leg $L_1$. Since the fuse current rating is 2 amps, the current level exceeds the current rating of the fuse $F_1$, and the fuse is blown or opened, which prevents current from flowing through the MOSFET $Q_1$.

However, the remaining MOSFETs $Q_2$ to $Q_n$ and fuses $F_2$ to $F_n$ remain operable, and when an activation voltage is again applied to the common gate of the MOSFETs $Q_n$, the operable MOSFETs $Q_2$ to $Q_n$ are turned on and current flows through the MOSFETs $Q_2$ to $Q_n$ and fuses $F_2$ to $F_n$. The load current (10 amps) now has only nine legs L through which to flow, and thus each leg L receives approximately 1.11 amps (10 amps/9 legs L). Since 1.11 amps is still below the fuse current rating of 2 amps, the legs $L_2$ to $L_n$ are still able to pass the full load current without opening any of the fuses $F_2$ to $F_n$. Accordingly, the solid-state circuit "self-heals" by removing from operating the faulty MOSFET $Q_1$, while continuing to operate with the remaining MOSFETs $Q_2$ to $Q_n$.

In this example embodiment, up to four fuses F may open while still allowing the remaining legs L to pass the full load current without opening the remaining fuses F. However, embodiments of the invention encompass any design of a solid-state switch including multiple legs L. For example, fuses F may be selected to have higher current ratings, such that the solid-state switch may operate with fewer legs L, or the fuses F may be selected to have lower current ratings, such that the solid-state switch may only operate with more legs L.

In embodiments of the invention, when a voltage is applied to a common gate of a solid-state switch, the common gate connected to multiple MOSFETs, all of the MOSFETs turn on to pass a substantially equal portion of a load current. The MOSFETs are each connected in series with a fuse, and the solid-state switch is configured such that when all of the MOSFETs are functional, the portion of the load current passed by each MOSFET is less than the current rating of the fuses. When one of the MOSFETs fails or remains in an activated state after the voltage is no longer applied to the common gate, the entire load current is directed across the failed MOSFET and the corresponding fuse. Consequently, the fuse opens, removing the failed MOSFET from operation.

The next time the voltage is applied to the common gate, only the remaining MOSFETs are activated and the load current is divided among only the remaining MOSFETs. By this "self-healing" function, the solid-state switch functions normally by passing the entire load current only with the remaining MOSFETs while not utilizing the failed MOSFET connected in series with the open fuse.

In embodiments of the invention, a solid-state circuit may be designed to be operable with a predetermined number of failed MOSFETs before the entire solid-state circuit fails. This may provide electrical systems with redundancy in critical systems, with time to repair or replace solid-state switches before a complete failure occurs, and with continuity of operation.

While embodiments of the invention have been illustrated with a common ground, embodiments include any configuration, including a high-side drive mode where a load is grounded and the MOSFETs push current to the load.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments have been chosen and described in order to best explain the principles of the invention and the practical application, and to enable others of ordinary skill in the art to understand the invention for various embodiments with various modifications as are suited to the particular use contemplated.

While the preferred embodiment of the invention has been described, it will be understood that those skilled in the art, both now and in the future, may make various improvements and enhancements which fall within the scope of the claims which follow.

What is claimed is:

1. A solid-state switch, comprising:
a plurality of transistors connected in parallel;
a plurality of fuses, each fuse of the plurality of fuses connected in series with a separate one of the plurality of transistors;
wherein a combination of current ratings of the plurality of fuses is greater than a load current of a load connected to the plurality of transistors and the plurality of fuses, and
a current rating of each separate fuse of the plurality of fuses less than the load current.

2. The solid-state switch of claim 1, wherein a combined current rating of at least two of the plurality of fuses, less than all of the plurality of fuses, is greater than the load current.

3. The solid-state switch of claim 1, wherein the load is a motor, and
the solid-state switch activates a solenoid switch to supply the load current to the load.

4. The solid-state switch of claim 1, wherein the plurality of fuses includes wires bonding a die including the plurality of transistors to a semiconductor chip package.

5. The solid-state switch of claim 1, wherein the plurality of fuses includes wiring of a predetermined width and length on a substrate.

6. The solid-state switch of claim 1, wherein the plurality of transistors and plurality of fuses are configured such that the load current is divided among the plurality of transistors based on an activation voltage being supplied to a shared gate connection of the plurality of transistors, and the load current flows through a first transistor of the plurality of transistors to open a first fuse of the plurality of fuses based on the first transistor being stuck in an activated state while the activation voltage is removed from the shared gate connection of the plurality of transistors.

7. The solid-state switch of claim 1, wherein a first fuse among the plurality of fuses is configured to be opened while the remaining fuses among the fuses are configured to remain intact based on a first transistor of the plurality of transistors remaining in an activated stated while an activation voltage is removed from a shared gate of the plurality of transistors.

8. The solid-state switch of claim 7, wherein the remaining transistors other than the first transistor are configured to pass the load current based on the activation voltage being re-applied to the shared gate of the plurality of transistors after the first fuse is opened.

9. A solid-state switch, comprising:
   a first transistor;
   a first fuse connected to one of a source and a drain of the first transistor and to a common node;
   a second transistor having a gate connected to a gate of the first transistor;
   a second fuse connected to one of a source and a drain of the second transistor and to the common node;
   a third transistor having a gate connected to the gates of the first and second transistors; and
   a third fuse connected to one of a source and a drain of the third transistor and to the common node,
   wherein the first transistor and first fuse are connected in parallel with the second transistor and the second fuse, and with the third transistor and the third fuse,
   a current rating of each of the first, second and third fuses is less than a load current of a load connected to the first, second and third transistors, and
   a combination of the current ratings of the first, second and third fuses is greater than the load current.

10. The solid-state switch of claim 9, wherein a combined current rating of any two of the first, second and third fuses is greater than the load current.

11. The solid-state switch of claim 9, wherein the first, second and third fuses include wires bonding a die including the first, second and third transistors to a semiconductor chip package.

12. The solid-state switch of claim 9, wherein the first, second and third fuses include wiring of a predetermined width and length on a substrate.

13. A motor assembly, comprising:
   a battery;
   a load configured to operate at a load current; and
   a solid-state switch connected between the battery and the load, the solid-state switch comprising a plurality of transistors connected in parallel between the battery and the load and a plurality of fuses connected in series with the plurality of transistors, such that each one of the plurality of fuses is connected in series with a separate one of the plurality of transistors, the plurality of transistors and the plurality of fuses configured such that a first fuse of the plurality of fuses is opened to prevent current flow through a first transistor based on the rest of the transistors being turned off and the first transistor remaining on.

14. The motor assembly of claim 13, wherein a combined current rating of the plurality of fuses is greater than the load current, and
   a current rating of each one of the plurality of fuses is less than the load current.

15. The motor assembly of claim 13, wherein a combined current rating of at least two of the plurality of fuses is greater than the load current.

16. The motor assembly of claim 13, wherein the load is a motor connected to the solid-state switch via a solenoid switch.

* * * * *